US010431762B2

(12) United States Patent
Jung et al.

(10) Patent No.: US 10,431,762 B2
(45) Date of Patent: Oct. 1, 2019

(54) DISPLAY DEVICE AND MANUFACTURING METHOD THEREOF

(71) Applicant: Samsung Display Co., Ltd., Yongin-si, Gyeonggi-do (KR)

(72) Inventors: Yang-Ho Jung, Seoul (KR); Seon Hwa Choi, Suwon-si (KR); Jun Gi Kim, Hwaseong-si (KR); Jeong Min Park, Seoul (KR); Beung Hwa Jeong, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/927,596

(22) Filed: Mar. 21, 2018

(65) Prior Publication Data

US 2019/0074465 A1 Mar. 7, 2019

(30) Foreign Application Priority Data

Sep. 7, 2017 (KR) .......................... 10-2017-0114750

(51) Int. Cl.
| | | |
|---|---|---|
| *H01L 51/50* | (2006.01) | |
| *H01L 51/56* | (2006.01) | |
| *H01L 51/52* | (2006.01) | |
| *H01L 51/00* | (2006.01) | |
| *H01L 27/32* | (2006.01) | |

(52) U.S. Cl.
CPC ........ *H01L 51/5012* (2013.01); *H01L 51/003* (2013.01); *H01L 51/5203* (2013.01); *H01L 51/56* (2013.01); *H01L 27/3248* (2013.01); *H01L 51/0097* (2013.01)

(58) Field of Classification Search
CPC ............. H01L 51/5012; H01L 51/5203; H01L 51/0097; H01L 51/56; H01L 27/3248
USPC ......................................................... 257/40
See application file for complete search history.

(56) References Cited

U.S. PATENT DOCUMENTS

| | | | |
|---|---|---|---|
| 7,787,097 B2 | 8/2010 | Satoh | |
| 9,176,535 B2 | 11/2015 | Bohn et al. | |
| 9,190,720 B2 | 11/2015 | Shedletsky | |
| 9,219,102 B2 | 12/2015 | Choi | |
| 2014/0133282 A1* | 5/2014 | Hamm | G04G 17/045 368/241 |
| 2014/0240985 A1 | 8/2014 | Kim et al. | |
| 2016/0079336 A1 | 3/2016 | Youn et al. | |

(Continued)

FOREIGN PATENT DOCUMENTS

| | | |
|---|---|---|
| EP | 2799154 A1 | 11/2014 |
| KR | 10-2013-0015142 A | 2/2013 |

(Continued)

*Primary Examiner* — Karen Kusumakar
*Assistant Examiner* — Adam S Bowen
(74) *Attorney, Agent, or Firm* — Lewis Roca Rothgerber Christie LLP

(57) ABSTRACT

A manufacturing method of a display device according to some embodiments includes: forming a protrusion pattern on a carrier glass; coating a polymer on the protrusion pattern to form a polymer layer; forming a stacked structure on the polymer layer, including a transistor and an organic light emitting element connected to the transistor; and separating the carrier glass and the protrusion pattern from the polymer layer, wherein an opening penetrating the polymer layer is formed during the separation of the protrusion pattern.

15 Claims, 15 Drawing Sheets

(56) References Cited

U.S. PATENT DOCUMENTS

| | | |
|---|---|---|
| 2016/0079533 A1 | 3/2016 | Gabel et al. |
| 2016/0093644 A1 | 3/2016 | Ki et al. |
| 2016/0093683 A1 | 3/2016 | Lee et al. |
| 2016/0233289 A1* | 8/2016 | Son ................... H01L 27/3258 |

FOREIGN PATENT DOCUMENTS

| | | |
|---|---|---|
| KR | 10-2014-0118222 A | 10/2014 |
| KR | 10-2014-0120510 A | 10/2014 |
| KR | 10-2015-0027956 A | 3/2015 |
| KR | 10-2016-0004386 A | 1/2016 |
| KR | 10-2016-0096282 A | 8/2016 |

* cited by examiner

DISPLAY DEVICE AND MANUFACTURING METHOD THEREOF

CROSS-REFERENCE TO RELATED APPLICATION

This application claims priority to and the benefit of Korean Patent Application No. 10-2017-0114750 filed in the Korean Intellectual Property Office on Sep. 7, 2017, the entire content of which is incorporated herein by reference.

BACKGROUND

1. Field

One or more aspects of example embodiments of the present disclosure relate to a display device and a manufacturing method thereof.

2. Description of the Related Art

A light emitting diode is an element in which holes supplied from an anode and electrons supplied from a cathode are combined in an organic emission layer to form excitons, and light is emitted while the excitons are stabilized.

A light emitting diode has several benefits, such as a wide viewing angle, a fast response speed, a thin thickness, and lower power consumption such that a light emitting diode is widely applied to various electrical and electronic devices such as televisions, monitors, mobile phones, etc.

Recently, a flexible display device including a light emitting diode or a front side display device of which the majority of one surface of the device facing the user is a display area have been proposed.

The above information disclosed in this Background section is only for enhancement of understanding of the background of the invention and therefore it may contain information that does not form prior art.

SUMMARY

Aspects of embodiments of the present disclosure relate to a manufacturing method of a display device for easily manufacturing an opening to which a module such as a camera is inserted, and a display device manufactured thereby.

A manufacturing method of a display device according to some embodiments includes forming a protrusion pattern on a carrier glass; coating a polymer on the protrusion pattern to form a polymer layer; forming a stacked structure on the polymer layer, including a transistor and an organic light emitting element connected to the transistor; and separating the carrier glass and the protrusion pattern from the polymer layer, wherein an opening penetrating the polymer layer is formed during the separation of the protrusion pattern.

The method may further includes forming an opening penetrating the stacked structure.

A thickness of the protrusion pattern and a thickness of the polymer layer may be substantially the same.

The forming of the polymer layer may further include etching the polymer to expose the protrusion pattern.

The protrusion pattern may include at least one selected from a group including a siloxane material having a ladder structure, a siloxane material having a cage structure, a polyphenyl-SQ, a polymethyl-SQ, a methyl resin, and a phenyl resin.

In some embodiments, the thickness of the protrusion pattern may be smaller than the thickness of the polymer layer.

The thickness of the protrusion pattern may be 50% or more and less than 100% of the thickness of the polymer layer.

The method may further include forming an opening overlapping the protrusion pattern and penetrating the polymer layer.

The protrusion pattern may include protrusions and depressions.

The opening may be formed to overlap a convex part of the protrusions and depressions of the protrusion pattern.

A display device according to some embodiments includes a substrate including a display area for displaying an image and a non-display area positioned around the display area; a transistor positioned in the display area of the substrate; an organic light emitting element connected to the transistor; and an opening positioned in the display area and penetrating the substrate for inserting a module.

The organic light emitting element may include a pixel electrode; a common electrode overlapping the pixel electrode; and an emission layer positioned between the pixel electrode and the common electrode, wherein the opening penetrates the pixel electrode and the common electrode.

The interior circumference of the opening may include protrusions and depressions.

The substrate may include protrusions and depressions, and the opening may overlap a recess portion of the substrate.

The substrate may include a polymer.

The polymer may be a polyimide and the display device may be flexible.

According to some embodiments, a display device may be provided in which a size of the display area relative to a non-display area is increased. Also, it is possible to provide a manufacturing method of a display device in which an opening for inserting a module, such as a camera, may be easily manufactured.

DETAILED DESCRIPTION

Figure 1A:
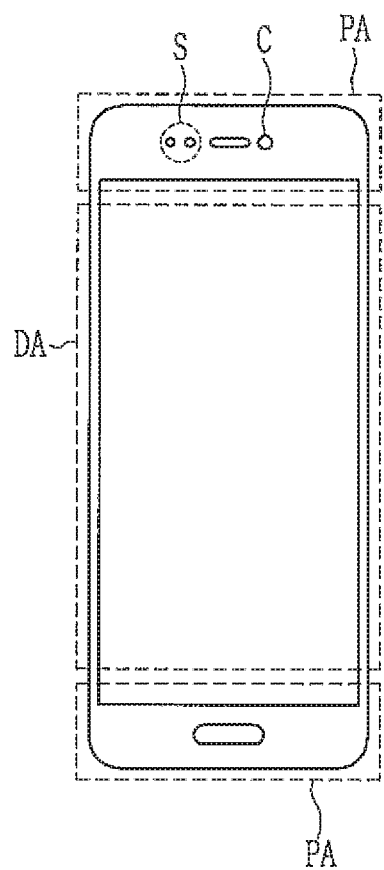
FIGS. 1 (a) and 1 (b) are schematic views of a display device.

Hereinafter, example embodiments will now be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

In the following description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

In the drawings, thicknesses of a plurality of layers and areas are illustrated in an enlarged manner for clarity and ease of description thereof.

Spatially relative terms such as "below", "beneath", "lower", "above", "upper" and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the example terms "below" and "under" may include both an orientation of above and below.

It will be further understood that the terms "comprises," "comprising," "includes" and/or "including," when used in this specification, specify the presence of stated features, integers, steps, operations, elements and/or components, but do not preclude the presence or addition of one or more other features, integers, steps, operations, elements, components and/or groups thereof.

It will be understood that when a layer, area, element, or plate is referred to as being "on," "connected to," or "coupled to" another layer, area, or plate, it may be directly on, connected, or coupled to the other layer, area, element, or plate, or intervening layers, areas, elements, or plates may be present therebetween. Conversely, when a layer, area, element, or plate is referred to as being "directly on," "directly connected to," or "directly coupled to" another layer, area, element, or plate, there are no intervening layers, areas, elements or plates therebetween. In addition, it will also be understood that when a layer, area, element, or plate is referred to as being "between" two layers, areas, elements, or plates, it can be the only layer, area, element, or plate between the two layers, areas, elements, or plates, or one or more intervening layers, areas, elements, or plates may also be present. Further when a layer, area, element, or plate is referred to as being "below" another layer, area, element, or plate, it may be directly below the other layer, area, element, or plate, or intervening layers, areas, elements, or plates may be present therebetween. Conversely, when a layer, area, or plate is referred to as being "directly below" another layer, area, element, or plate, intervening layers, areas, elements, or plates may be absent therebetween.

As used herein, the terms "substantially," "about," "approximately" and similar terms are used as terms of approximation and not as terms of degree, and are intended to account for the inherent deviations in measured or calculated values that would be recognized by those of ordinary skill in the art. Further, these terms as used herein are inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

When a certain embodiment may be implemented differently, a specific process order may be performed differently from the described order. For example, two consecutively described processes may be performed substantially at the same time or performed in an order opposite to the described order.

Expressions such as "at least one of," when preceding a list of elements, modify the entire list of elements and do not only modify the individual elements of the list. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Figure 1B:
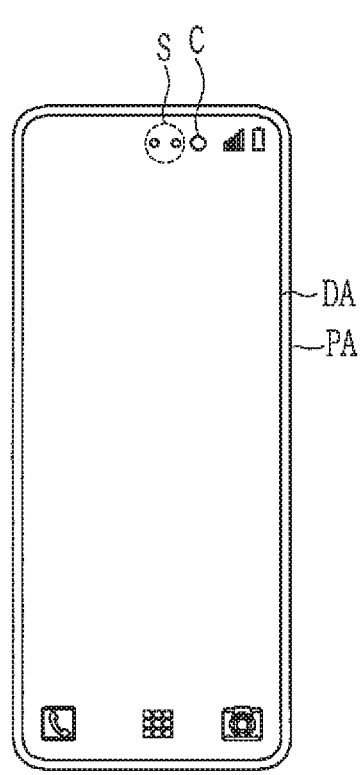
Figure 2:
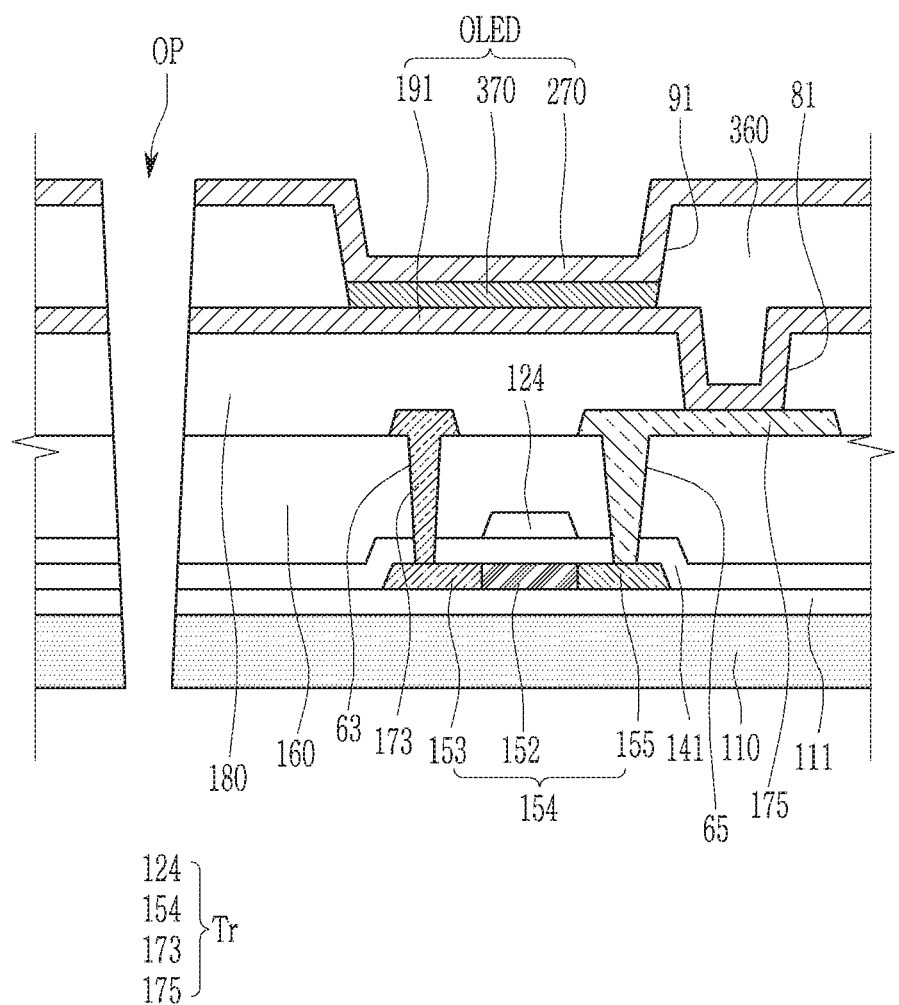
FIG. 2 is a cross-sectional view of display device having a pixel adjacent to an opening to which a module is inserted.

Hereinafter, a display device according to some embodiment of the present disclosure will be described with reference to FIG. 1 (a) to FIG. 2. FIGS. 1 (a) and 1 (b) are schematic views of a display device, and FIG. 2 is a cross-sectional view of display device having a pixel adjacent to an opening to which a module (as an example, a camera) is inserted.

FIG. 1 (a) depicts a conventional display device including a display area DA having surface for displaying an image and a non-display area PA enclosing the display area DA. FIG. 1 (a) also includes a camera C and a sensor S that are positioned in the non-display area PA.

FIG. 1 (b) depicts a display device according to some embodiments of the present disclosure. In the display device of FIG. 1 (b), most of a front side of the display device is a display area DA, and the display area DA extends to an outer portion of the front side (e.g., the display area DA extends to top and bottom outer portions of the front side of the display device), as opposed to FIG. 1 (a) in which the display area DA does not extend to top and bottom outer portions of the front side.

Different from the conventional display device of FIG. 1 (a), the display device according to some embodiments of the present disclosure may include the camera C and the sensor S positioned in the display area DA, as shown in FIG. 1 (b). In the display device according to some embodiments, since most of the front side of the display device is provided as the display area DA, the camera C and the sensor S may be positioned in the display area DA.

Next, one pixel forming the display area and an opening OP adjacent to the pixel and to which a module is inserted (for example, a camera) will be described with reference to FIG. 2.

A substrate 110 may be included, which may be a transparent insulation substrate including a polymer, and as one example, the polymer may be a polyimide. The substrate 110 according to some embodiments may have flexibility.

A buffer layer 111 may be positioned on the substrate 110, however the buffer layer 111 may be omitted in some embodiments. The buffer layer 111 may include an inorganic material such as a silicon oxide and a silicon nitride. The buffer layer 111 may prevent an impurity degrading a characteristic of a below-described semiconductor layer 154 from being diffused, and penetration of moisture.

A semiconductor layer 154 of a transistor TR is positioned on the buffer layer 111. The semiconductor layer 154 includes a channel region 152, with a source region 153 and a drain region 155 positioned at respective sides of the channel region 152 and doped with an impurity. The semiconductor layer 154 may include a polysilicon, an amorphous silicon, or an oxide semiconductor.

In some embodiments, a light blocking electrode may be positioned between the substrate 110 and the semiconductor layer 154. The light blocking electrode prevents external light from reaching the semiconductor layer 154, thereby preventing characteristic deterioration of the semiconductor layer 154 and minimizing a leakage current of the transistor TR.

A gate insulating layer 141 is positioned on the semiconductor layer 154. The gate insulating layer 141 may be positioned to overlap the entire surface of the substrate 110 (e.g. in a planar view). The gate insulating layer 141 may include an inorganic insulating material such as a silicon oxide (SiOx), a silicon nitride (SiNy), and the like.

A gate conductor including a gate electrode 124 of the transistor TR is positioned on the gate insulating layer 141. The gate electrode 124 may overlap the channel region 152 of the semiconductor layer 154.

The gate conductor may include a metal such as molybdenum (Mo), copper (Cu), aluminum (Al), silver (Ag), chromium (Cr), tantalum (Ta), titanium (Ti), or metal alloys thereof, and may be formed of a single layer or a multilayer.

An interlayer insulating layer 160 that may include an inorganic insulating material or an organic insulating material is positioned on the gate electrode 124.

A data conductor including a source electrode 173 and a drain electrode 175 of the transistor TR, a data line (not shown), and a driving voltage line (not shown) are positioned on the interlayer insulating layer 160. The source electrode 173 and the drain electrode 175 may be respectively connected to the source region 153 and the drain region 155 of the semiconductor layer 154 through contact holes 63 and 65 formed in the interlayer insulating layer 160 and the gate insulating layer 141.

The data conductor may include a metal such as aluminum (Al), copper (Cu), silver (Ag), gold (Au), platinum (Pt), palladium (Pd), nickel (Ni), molybdenum (Mo), tungsten (W), titanium (Ti), chromium (Cr), tantalum (Ta), or metal alloys thereof, and may be formed of the single layer or the multilayer (e.g., Ti/Al/Ti, Mo/Al/Mo, Mo/Cu/Mo, etc.).

The gate electrode 124, the source electrode 173, and the drain electrode 175 form the transistor TR along with the semiconductor layer 154. The shown transistor TR may be a driving transistor in the pixel of the organic light emitting device. Also, the shown transistor TR may be referred to as a top-gate transistor since the gate electrode 124 is positioned on the semiconductor layer 154. The structure of the transistor TR is not limited thereto or thereby, and may be variously changed, for example, the transistor TR may be a bottom-gate transistor in which the gate electrode is positioned under the semiconductor.

A planarization layer 180 is positioned on the interlayer insulating layer 160 and the data conductor. The planarization layer 180 serves to remove and planarize a step (e.g., a step change) in order to increase emission efficiency of the organic light emitting element to be formed thereon. The planarization layer 180 may cover the transistor TR.

The planarization layer 180 may include an organic insulating material, for example. The organic insulating material may include polyimide, polyamide, polyacrylate, polyphenylene ether, polyphenylene sulfide, unsaturated polyester, an epoxy resin, phenol resin, and the like, however the material is not limited thereto or thereby.

A pixel electrode 191 is positioned on the planarization layer 180. The pixel electrode 191 is connected to the drain electrode 175 of the transistor TR through a contact hole 81 of the planarization layer 180.

The pixel electrode 191 may be formed of a reflective conductive material or a semi-transmissive conductive material, or may be formed of a transparent conductive material. For example, the pixel electrode 191 may include a transparent conductive material such as indium tin oxide (ITO) and indium zinc oxide (IZO), or a metal such as lithium (Li), calcium (Ca), aluminum (Al), silver (Ag), magnesium (Mg), and gold (Au).

A pixel definition layer 360 is positioned on the planarization layer 180 and the pixel electrode 191. The pixel definition layer 360 has an opening 91 overlapping a part of the pixel electrode 191. The opening 91 of the pixel definition layer 360 may limit the region corresponding to the pixel. The pixel definition layer 360 may include an organic insulating material such as polyimide, polyacrylate, and polyamide.

An emission layer 370 is positioned on the pixel electrode 191. The emission layer 370 may include an emission region, and may additionally include at least one among a hole injection region, a hole transport region, an electron injection region, and an electron transport region. The emission layer may be made of an organic material which uniquely emits light of one primary color, such as red, green, and blue, and may have a structure in which a plurality of organic material layers emitting light of different colors are stacked.

A common electrode 270 transmitting a common voltage is positioned on the emission layer 370. The common electrode 270 may include a transparent conductive material such as indium tin oxide (ITO) and indium zinc oxide (IZO). The common electrode 270 may be made of a transparent conductive material, or may formed by thinly laminating metals such as calcium (Ca), barium (Ba), magnesium (Mg), aluminum (Al), and silver (Ag) to have a light-transmitting property. In some embodiments, at least one protection layer or functional layer may be positioned on the common electrode 270.

The pixel electrode 191, the light emission layer 370, and the common electrode 270 of each pixel form a light-emitting element of an organic light emitting diode (OLED).

Here, the pixel electrode 191 may be an anode of a hole injection electrode, and the common electrode 270 may be a cathode of an electron injection electrode. In contrast, the pixel electrode 191 may be the cathode, and the common electrode 270 may be the anode. Holes and electrons are injected into the light emission layer 370 from the pixel electrode 191 and the common electrode 270, respectively, and exitons generated by coupling the injected holes and electrons fall from an excited state to a ground state to emit light.

The display device according to some embodiments includes a module such as the camera C and the sensor S that are positioned in the display area DA. The opening OP into which the module is inserted may be positioned in the display area adjacent to the pixel.

The opening OP may penetrate the substrate 110, the buffer layer 111, the gate insulating layer 141, the interlayer insulating layer 160, the planarization layer 180, and the pixel definition layer 360, as above-described, and may also penetrate the pixel electrode 191 and the common electrode 270 in some embodiments.

The interior circumference of the opening OP may include protrusions and depressions. The opening OP may be manufactured through a single process, and may be manufactured through a process of multiple steps. Depending on the manufacturing process, the opening OP can be manufactured in such a way that the diameter of the opening OP differs in some regions.

Next, the manufacturing method of the above-described display device will be described with reference to FIG. 3 to FIG. 8. FIGS. 3 to 8 are cross-sectional views according to a manufacturing method of the display device of FIG. 2.

Figure 3:
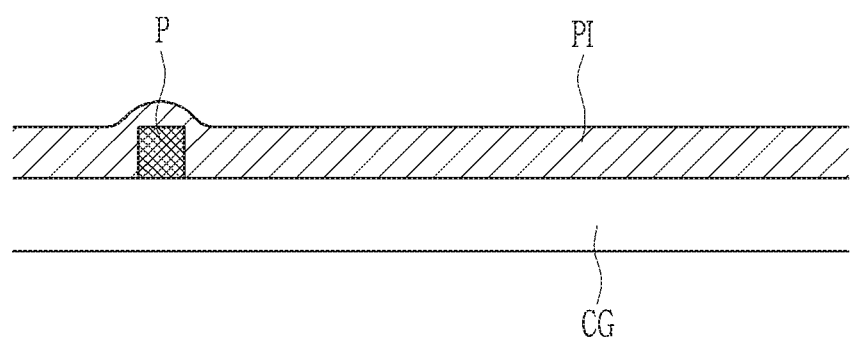
FIG. 3, FIG. 4, FIG. 5, FIG. 6, FIG. 7, and FIG. 8 are cross-sectional views of a manufacturing method of the display device of FIG. 2 according to some embodiments.

Referring to FIG. 3, a protrusion pattern P is formed on a carrier glass CG, and a polymer forming the substrate 110 is coated on the carrier glass CG to form a polymer layer Pl. The polymer may be polyimide as one example, but the material of the polymer is not limited thereto or thereby. The polymer layer Pl may have a shape that is protruded upward in the region overlapping the protrusion pattern P.

The protrusion pattern P may be formed at the position overlapping the opening OP to insert a module, such as a camera.

The protrusion pattern P may include a high heat resistant material, and can include, for example, an organic material. The organic material may have heat resistance to a temperature of more than about 400 degrees (° C.), and as one example, about 480 degrees (° C.). The organic material may include at least one selected from a group including a siloxane material having a ladder structure, a siloxane material having a cage structure, polyphenyl-SQ, polymethyl-SQ, methyl resin, and phenyl resin as one example. Also, according to some embodiments, the protrusion pattern P may include a photosensitive material.

Figure 4:
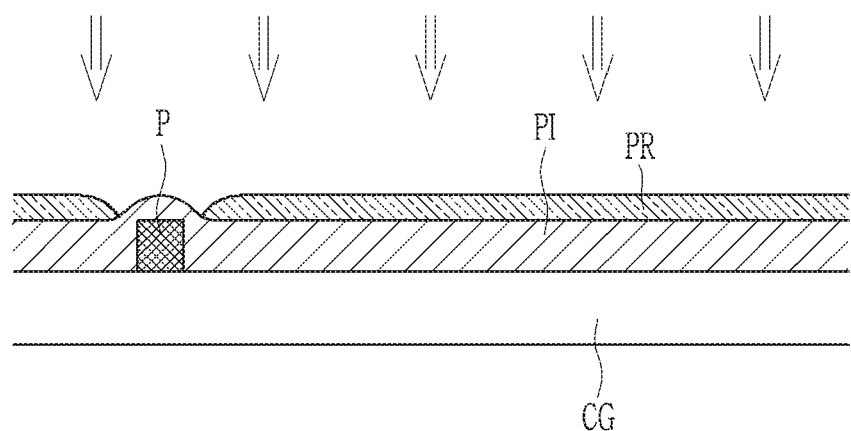
Figure 5:
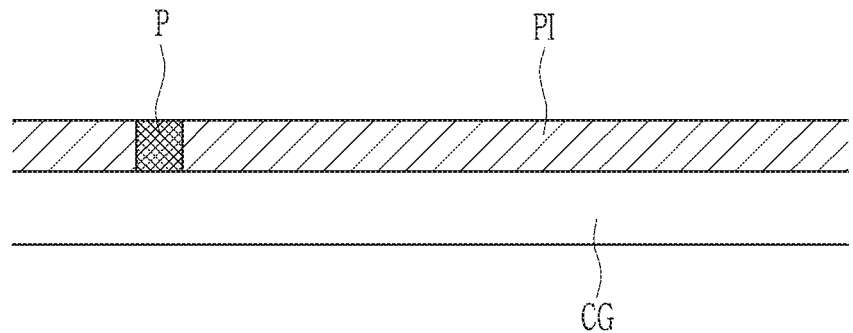

Next, as shown in FIG. 4, a photosensitive pattern PR is formed on the polymer layer Pl, and exposure is performed on an entire surface of the carrier glass CG. In some embodiments, the photosensitive pattern PR may not be formed on the portion of the polymer layer Pl overlapping the protrusion pattern P. Next, through a developing process and a removing process of the photosensitive mask PR, as shown in FIG. 5, a polymer layer Pl may be formed that exposes the protrusion pattern P (e.g., an upper surface of the protrusion pattern P may be exposed). The thicknesses of the protrusion pattern P and the polymer layer Pl according to some embodiments are substantially the same, and the upper surfaces of the protrusion pattern P and the polymer layer Pl may be formed at substantially the same surface (e.g., the upper surfaces of the protrusion pattern P and the polymer layer Pl may be approximately coplanar).

Figure 6:
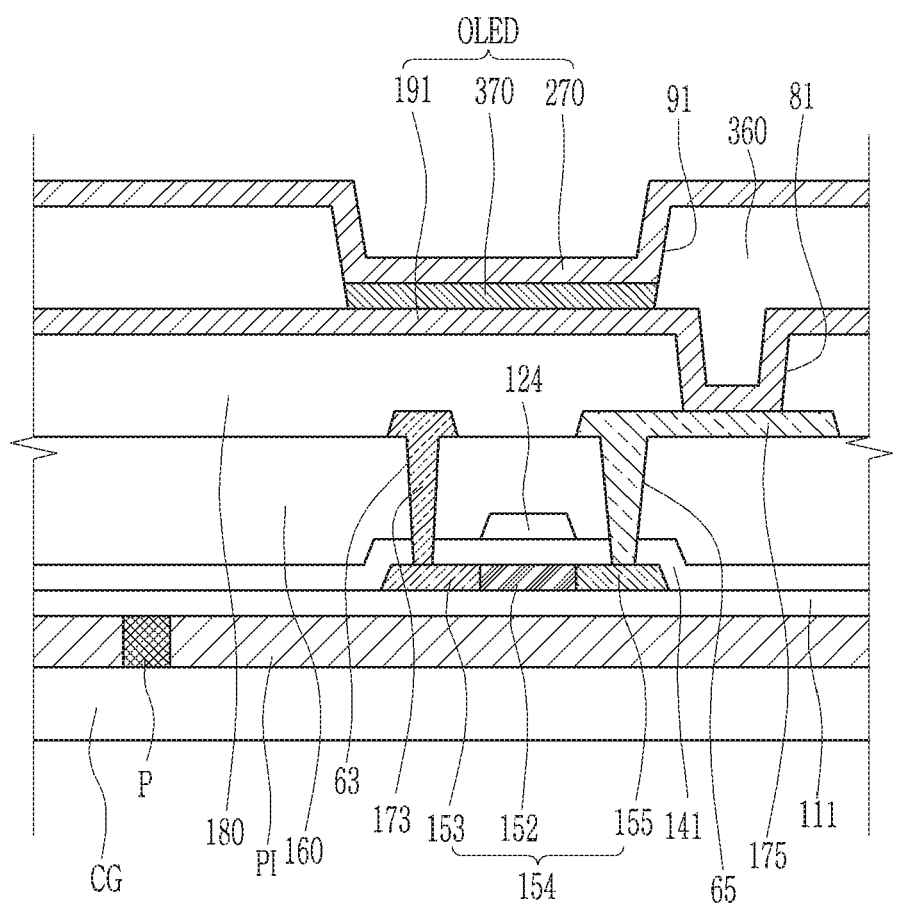

Next, as shown in FIG. 6, a stacked structure including a buffer layer 111, a semiconductor layer 154, a gate insulating layer 141, a gate conductor including a gate electrode 124, an interlayer insulating layer 160, a data conductor including a source electrode 173 and a drain electrode 175, a planarization layer 180, an organic light emitting element OLED, and a pixel definition layer 360 are formed on the polymer layer Pl and the protrusion pattern P.

Figure 7:
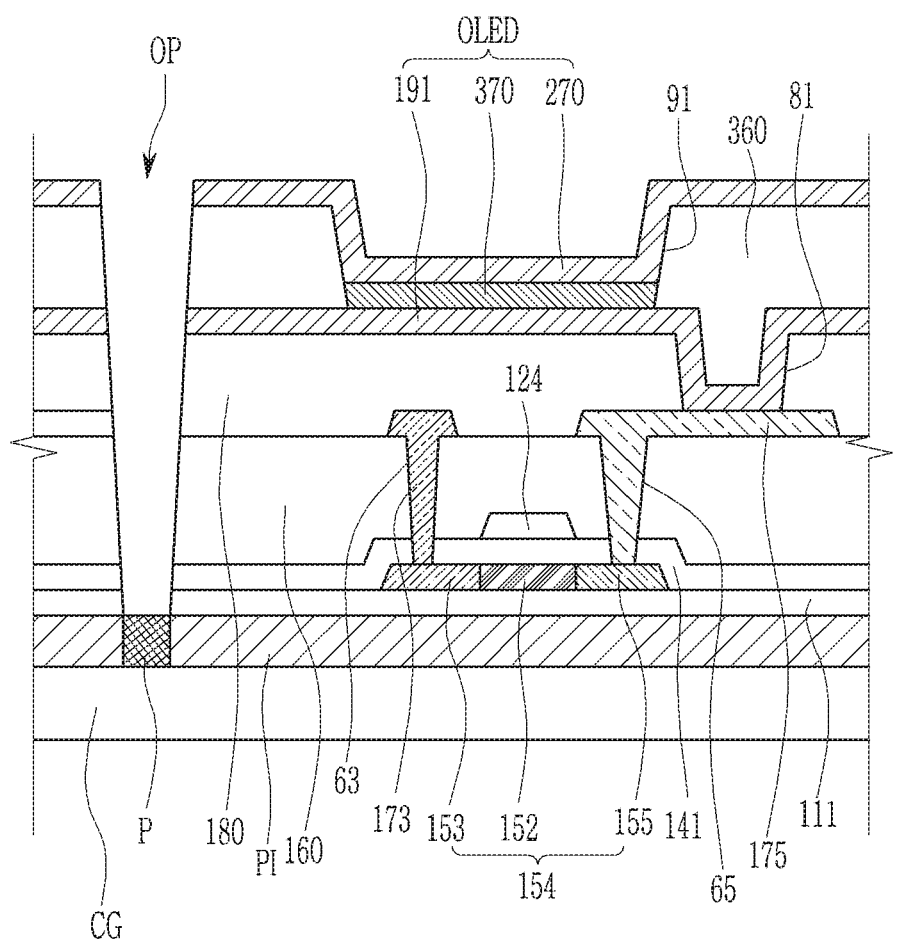

Next, as shown in FIG. 7, an opening OP penetrating the stacked structure manufactured in FIG. 6 is formed at a position overlapping the protrusion pattern P.

The present specification describes a configuration forming the opening OP through a single process, however the invention is not limited thereto or thereby, and the opening OP may be formed through a plurality of processes. For example, the opening OP may be formed along with the process forming the contact holes 63 and 65 in the interlayer insulating layer 160, the process forming the contact hole 81 in the planarization layer 180, and/or the process forming the opening 91 of the pixel definition layer 360. The interior circumference of the opening OP formed through a plurality of processes may include protrusions and depressions that are partially uneven.

Figure 8:
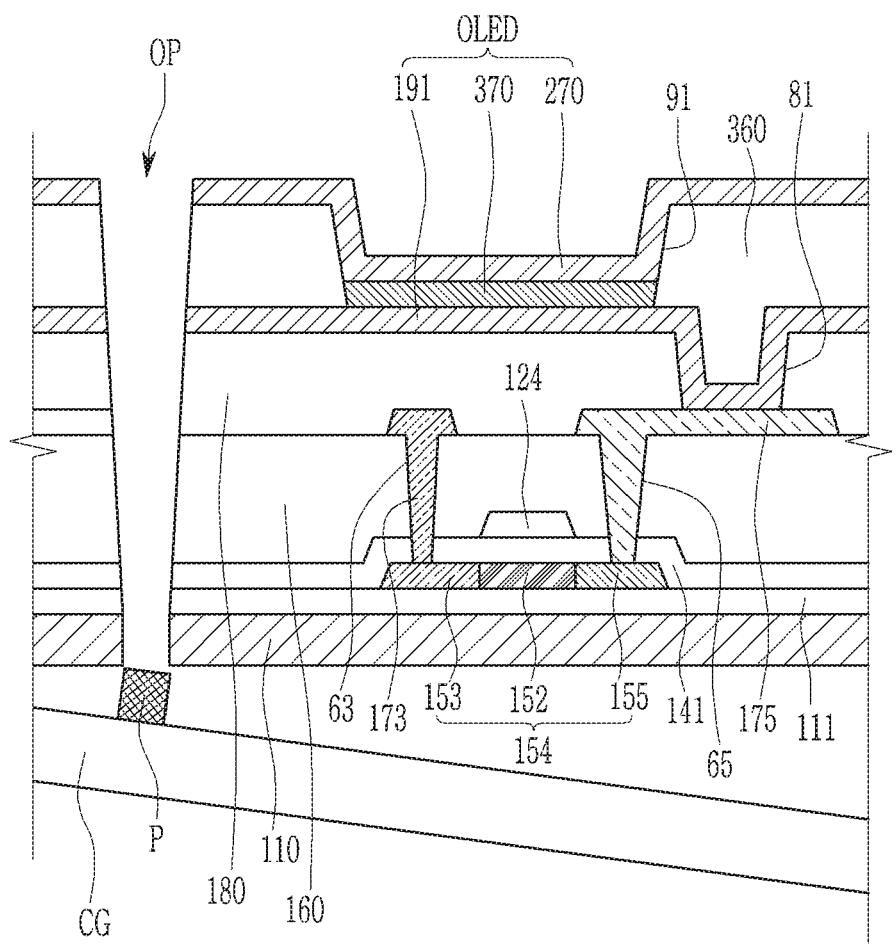

Next, as shown in FIG. 8, the carrier glass CG and the protrusion pattern P are separated from the polymer layer Pl and the stacked structure to provide the display device as shown in FIG. 2. The carrier glass CG is removed simultaneously with the protrusion pattern P formed in the same surface as the polymer layer Pl, and the opening OP penetrating the polymer layer Pl is formed in the region of the polymer layer Pl where the protrusion pattern P was positioned. The opening OP may be formed in the substrate 110 as well as the pixel definition layer 360, the planarization layer 180, the interlayer insulating layer 160, the gate insulating layer 141, and the buffer layer 111 included in the stacked structure.

In some embodiments, the opening OP is formed in a stacked structure having a considerable thickness sufficient to position a module, such as a camera, in the display area. A conventional process of forming an opening uses a laser drilling process and the like (e.g., to form an opening in a substrate). However, these processes can suffer from problems, including large expenses and the occurrence of impurities.

However, according to some embodiments of the present invention, the opening OP in the substrate 110 may be manufactured by the separation of the carrier glass CG and the protrusion pattern P from the polymer layer Pl and the stacked structure. Thus, a separate process to form the opening OP in the substrate 110 may be omitted such that a process load may be reduced.

Figure 9:
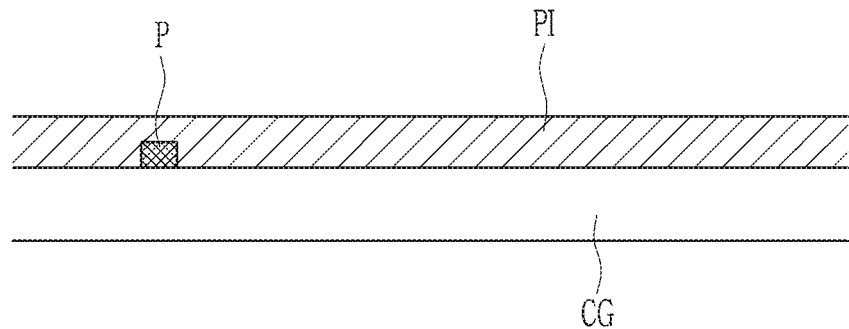
FIG. 9, FIG. 10, and FIG. 11 are cross-sectional views of a manufacturing method of a display device according to some embodiments.
Figure 10:
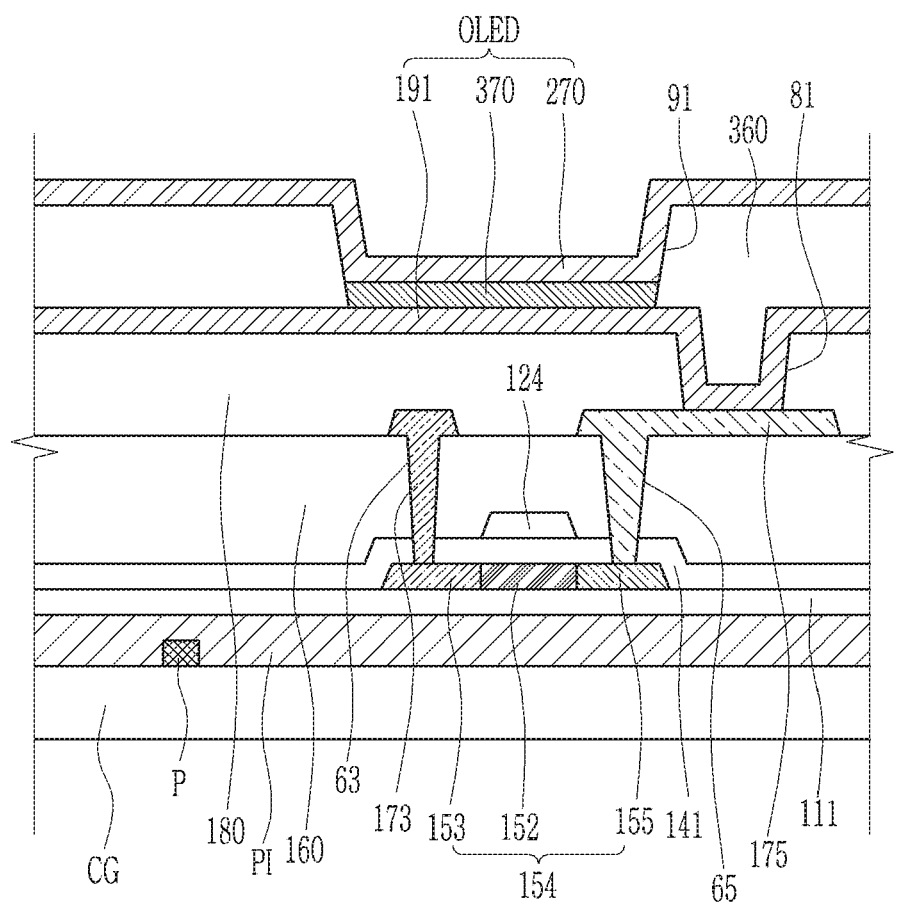
Figure 11:
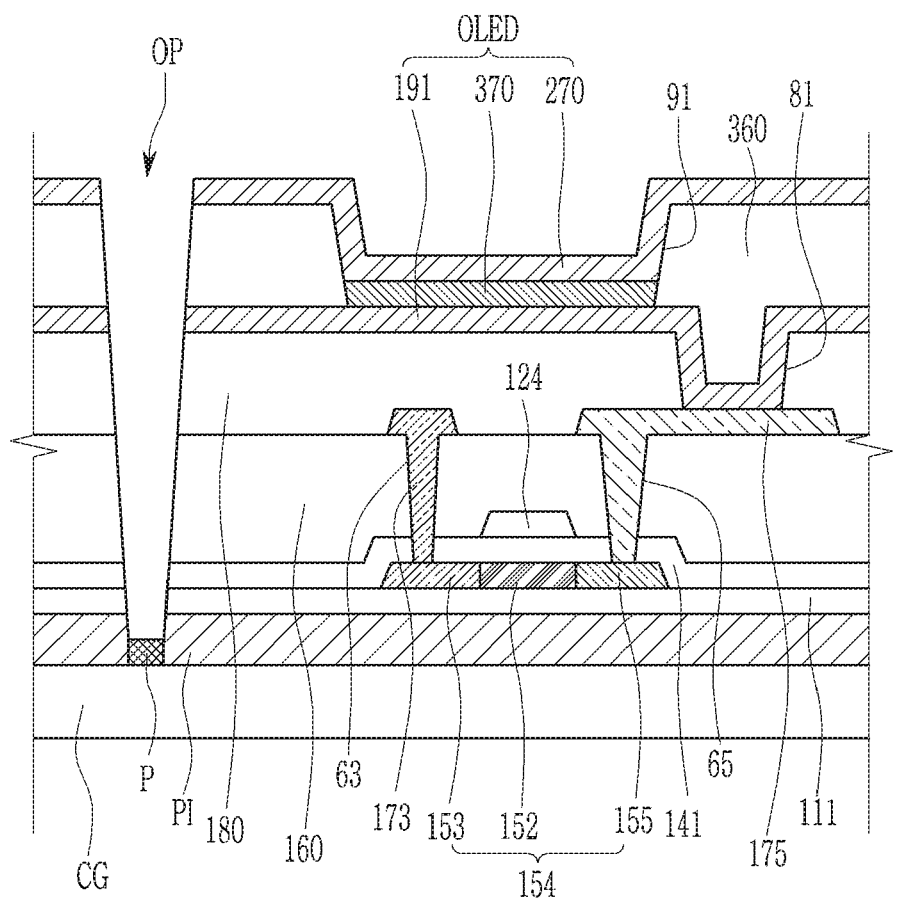

Next, the manufacturing method of the display device according to some embodiments of the present invention will be described with reference to FIG. 9 to FIG. 11. FIG. 9, FIG. 10, and FIG. 11 are cross-sectional views according to a manufacturing method of a display device according to some embodiments. Descriptions of the configurations of FIGS. 9 to 11 similar to those of the constituent elements described above are omitted.

Referring to FIG. 9, the protrusion pattern P is formed on the carrier glass CG. The polymer is coated on the carrier glass CG to form the polymer layer Pl, including the portion of the carrier glass CG on which the protrusion pattern P is positioned.

The height of the protrusion pattern P may be about 50% or more and less than 100% of the thickness of the polymer layer Pl, and as one example, the height of the protrusion pattern P may be about 50 to 70% of the thickness of the polymer layer Pl. Conversely, the thickness of the portion of the polymer layer Pl that overlaps the protrusion pattern P has a thickness between 0% and not more 50% with respect to the thickness of the polymer layer Pl that does not overlap the protrusion pattern P. In the coating process of the polymer, the polymer layer Pl may be provided with a flat shape without a separate step.

Next, referring to FIG. 10, as above-described, the stacked structure is formed on the polymer layer Pl and the protrusion pattern P, wherein the buffer layer 111, the semiconductor layer 154, the gate insulating layer 141, the gate conductor, the interlayer insulating layer 160, the data conductor, the planarization layer 180, the light-emitting element OLED, and the pixel definition layer 360 are sequentially positioned.

Next, as shown in FIG. 11, the opening OP penetrating the stacked structure is formed at a position overlapping the protrusion pattern P. The opening OP may also be formed in the polymer layer Pl to form the substrate 110, as well as the buffer layer 111, the gate insulating layer 141, the interlayer insulating layer 160, the planarization layer 180, and the pixel definition layer 360.

The manufacturing method of the display device according to some embodiments may further include the process of removing the polymer layer Pl overlapping the protrusion pattern P. As described above, the portion of the polymer layer Pl overlapping the protrusion pattern P has a thickness of more than 0% and not more 50% with respect to the thickness of the polymer layer Pl that does not overlap the protrusion pattern P. The removal process of the polymer layer Pl for the corresponding thickness may be performed (i.e., the removal process may be performed by only removing the portion of the thickness of the polymer layer Pl that overlaps the protrusion pattern P and not the entire thickness of the polymer layer Pl). In the removing process according to such embodiments, the burden of the process is smaller than in a process of forming an opening that completely penetrates the polymer layer Pl, and stable formation is possible.

Next, the manufacturing method of the display device according to some embodiments of the protrusion pattern will be described with reference to FIG. 12 to FIG. 15. FIGS. 12 to 15 are cross-sectional views according to a manufacturing method of a display device according to some embodiments. The descriptions in in FIG. 12 to FIG. 15 for the same or similar constituent elements to those above are omitted.

Figure 12:
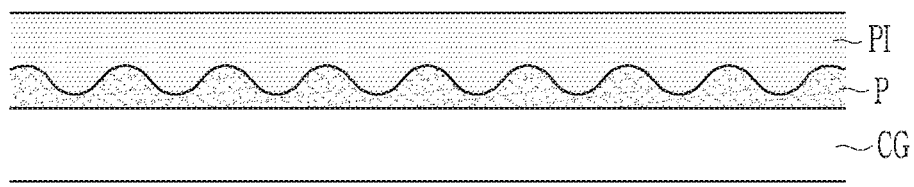
FIG. 12, FIG. 13, FIG. 14, and FIG. 15 are cross-sectional views of a manufacturing method of a display device according to some embodiments.

Referring to FIG. 12, the protrusion pattern P including protrusions and depressions is formed on the carrier glass CG, and then the polymer is coated on the protrusion pattern P to form the polymer layer Pl. In some embodiments, the protrusion pattern P is formed on an entire surface of the carrier glass CG.

Figure 13:
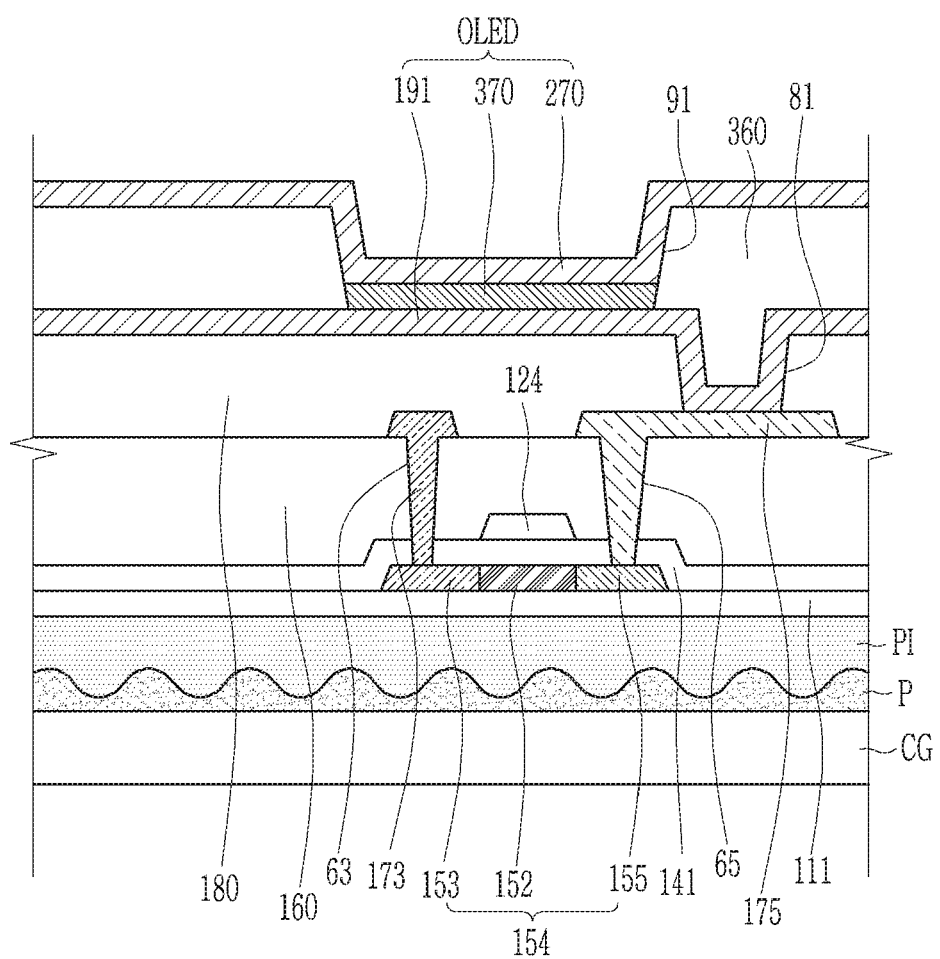

Next, referring to FIG. 13, the stacked structure is formed on the polymer layer Pl and the protrusion pattern P, wherein the buffer layer 111, the semiconductor layer 154, the gate insulating layer 141, the gate conductor, the interlayer insulating layer 160, the data conductor, the planarization layer 180, the light-emitting element OLED, and the pixel definition layer 360 are sequentially disposed is formed on the polymer layer Pl and the protrusion pattern P.

Figure 14:
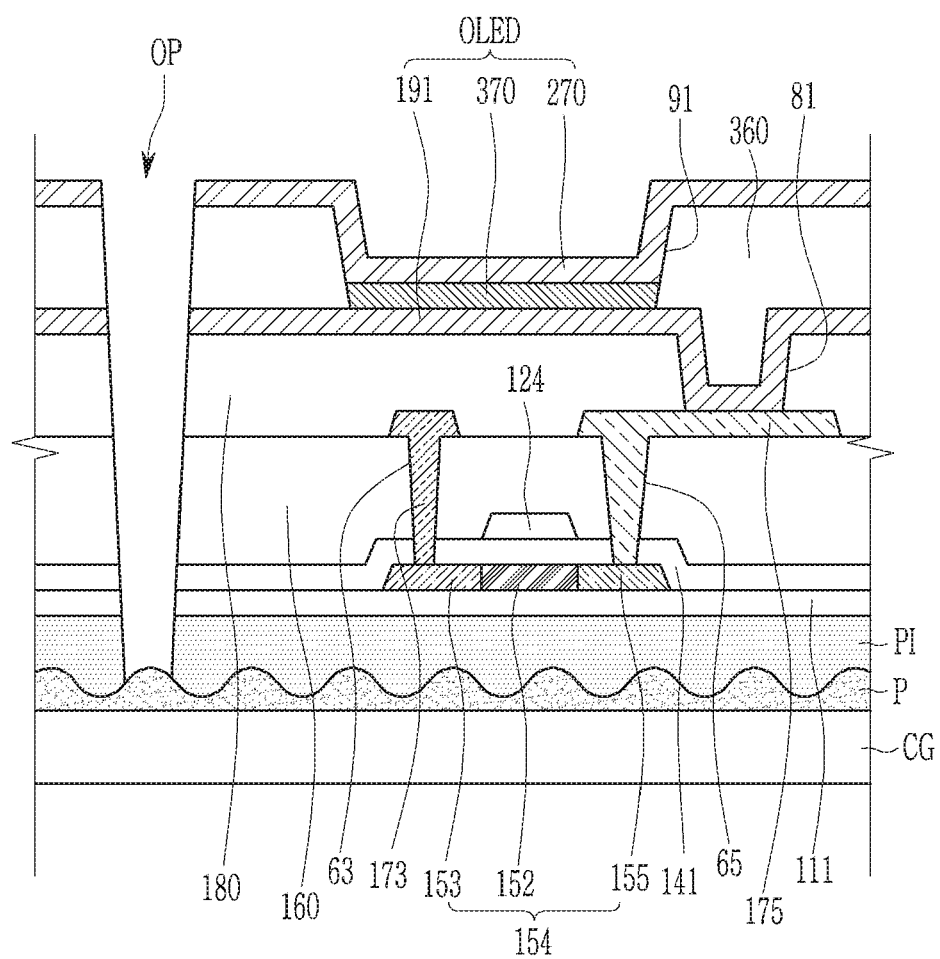
Figure 15:
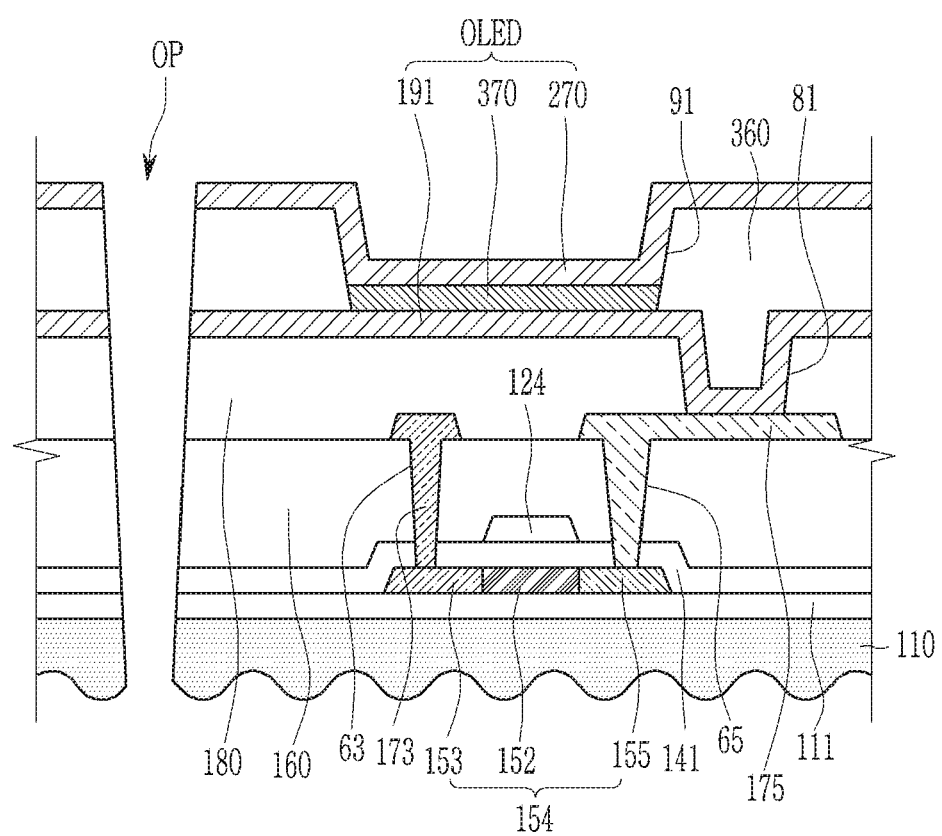

Next, referring to FIG. 14, the opening OP penetrating the stacked structure is formed at the position in which the module will be inserted. The opening OP may overlap a convex part of the protrusion pattern P. Next, the carrier glass CG and the protrusion pattern P are removed, thereby providing the display device as shown in FIG. 15.

According to the above-described manufacturing method, the process of manufacturing the opening OP penetrating the substrate 110 may be simplified, and a display device having improved flexibility may be provided through the substrate 110 including protrusions and depressions.

Although example embodiments of the present invention have been described, it is understood that the present invention is not limited to these example embodiments, but various changes and modifications can be made by one of ordinary skill in the art within the spirit and scope of the present invention as hereinafter claimed.

Therefore, the disclosed subject matter is not be limited to any single embodiment described herein, and the above-described embodiments are to be considered illustrative and not restrictive. Accordingly, the scope of the present inventive concept shall be determined only according to the attached claims, and equivalents thereof.

DESCRIPTION OF SYMBOLS

CG: carrier glass
P: protrusion pattern
Pl: polymer layer
OLED: organic light emitting element
OP: opening

What is claimed is:

1. A method for manufacturing a display device comprising:
    forming a protrusion pattern on a carrier glass;
    coating a polymer on the protrusion pattern to form a polymer layer;
    forming a stacked structure on the polymer layer, the stacked structure including a transistor and an organic light emitting element connected to the transistor; and
    separating the carrier glass and the protrusion pattern from the polymer layer,
    wherein an opening penetrating through the polymer layer is formed via the separation of the protrusion pattern from the polymer layer.

2. The method of claim 1, further comprising forming an opening penetrating the stacked structure.

3. The method of claim 2, wherein a thickness of the protrusion pattern and a thickness of the polymer layer are substantially the same.

4. The method of claim 3, wherein the forming of the polymer layer further includes etching the polymer to expose the protrusion pattern.

5. The method of claim 1, wherein the protrusion pattern includes at least one selected from a group including a siloxane material having a ladder structure, a siloxane material having a cage structure, a polyphenyl-SQ, a polymethyl-SQ, a methyl resin, and a phenyl resin.

6. The method of claim 1, wherein a thickness of the protrusion pattern is smaller than a thickness of the polymer layer.

7. The method of claim 6, further comprising forming an opening in a portion of the polymer layer overlapping the protrusion pattern, wherein the opening penetrates through the polymer layer.

8. The method of claim 1, wherein the protrusion pattern includes protrusions and depressions.

9. The method of claim 8, wherein the opening is formed to overlap a convex part of the protrusions and depressions of the protrusion pattern.

10. The method of claim 1, wherein the display device includes a display area and a non-display area positioned around the display area, and the opening is positioned in the display area.

11. A display device comprising:
- a substrate including a display area for displaying an image and a non-display area positioned around the display area;
- a transistor positioned in the display area of the substrate;
- an organic light emitting element connected to the transistor; and
- an opening positioned in the display area and penetrating the substrate for inserting a module,
- wherein an interior circumference of the opening includes protrusions and depressions.

12. The display device of claim 11, wherein the organic light emitting element includes:
- a pixel electrode;
- a common electrode overlapping the pixel electrode; and
- an emission layer positioned between the pixel electrode and the common electrode,
- wherein the opening penetrates the pixel electrode and the common electrode.

13. The display device of claim 11, wherein the substrate includes protrusions and depressions, and the opening overlaps a recess portion of the substrate.

14. The display device of claim 11, wherein the substrate includes a polymer.

15. The display device of claim 14, wherein the polymer is polyimide and the display device is flexible.

* * * * *